United States Patent
Jagielski et al.

(10) Patent No.: US 6,868,260 B2
(45) Date of Patent: Mar. 15, 2005

(54) RADIO STATION WITH OPTIMIZED IMPEDANCE

(75) Inventors: Ole Jagielski, Aalborg (DK); Ulrik Riis Madsen, Oak Ridge, NC (US)

(73) Assignee: Siemens Aktiengesellschaft, Munich (DE)

( * ) Notice: Subject to any disclaimer, the term of this patent is extended or adjusted under 35 U.S.C. 154(b) by 519 days.

(21) Appl. No.: 09/811,879

(22) Filed: Mar. 19, 2001

(65) Prior Publication Data

US 2002/0044100 A1 Apr. 18, 2002

(Under 37 CFR 1.47)

(30) Foreign Application Priority Data

Mar. 18, 2000 (EP) .............................. 00105812

(51) Int. Cl.⁷ ................................................ H04K 3/00
(52) U.S. Cl. .................................... 455/107; 455/115.2
(58) Field of Search ................................ 455/107, 289, 455/283, 285, 234.1, 115.2, 127.1, 127.2

(56) References Cited

U.S. PATENT DOCUMENTS

| | | | | |
|---|---|---|---|---|
| 3,662,294 A | * | 5/1972 | Jacobs et al. ................. 333/33 |
| 5,450,088 A | * | 9/1995 | Meier et al. ................... 342/51 |
| 5,491,715 A | * | 2/1996 | Flaxl ........................... 375/344 |
| 5,722,056 A | * | 2/1998 | Horowitz et al. ........... 455/126 |
| 5,862,458 A | * | 1/1999 | Ishii ............................ 455/107 |
| 5,991,643 A | * | 11/1999 | Chao-Cheng ............ 455/575.7 |
| 6,005,891 A | * | 12/1999 | Chadwick et al. .......... 375/224 |
| 6,018,324 A | * | 1/2000 | Kitchener ................... 343/795 |
| 6,625,428 B1 | * | 9/2003 | Finnell et al. ........... 455/115.1 |
| 2001/0044283 A1 | * | 11/2001 | Yajima ....................... 455/107 |

* cited by examiner

Primary Examiner—Lester G. Kincaid
Assistant Examiner—Sam Bhattacharya
(74) Attorney, Agent, or Firm—Laurance A. Greenberg; Werner H. Stemer; Gregory L. Mayback

(57) ABSTRACT

A radio station optimizes the impedance. An antenna of a transmitter of the radio station matches an output impedance of a power amplifier by adding an impedance with a variable reactance. A processor adjusts the variable reactance of the impedance according to an output signal of the power amplifier. The impedance with the variable reactance preferably includes either a plurality of inductors and capacitors, variable inductors and capacitors, or a plurality of microstrip lines. The processor calculates an optimum value for the variable reactance according to a measurement of the output signal of the power amplifier and stores those values for those measured values. In this way, a table is created, so that when the output signal is again measured the processor can use this table to determine which variable reactance will lead to impedance matching.

13 Claims, 4 Drawing Sheets

RADIO STATION WITH OPTIMIZED IMPEDANCE

BACKGROUND OF THE INVENTION

1. Field of the Invention

The invention relates to a radio station for transmitting signals. The radio station includes a modulator modulating the signal to be transmitted, a power amplifier amplifying the modulated signals, a summing device subtracting a test signal of the power amplifier for a reference signal to generate a control signal and an antenna for transmitting and receiving the signals.

In GSM (Global System for Mobile Communications), antennas in mobile phones are optimized for a predefined resonance frequency and a given frequency bandwidth.

2. Summary of the Invention

It is accordingly an object of the invention to provide a radio station for transmitting signals that overcomes the hereinafore-mentioned disadvantages of the heretofore-known devices of this general type and, in which, a change of a resonance frequency of the antenna is minimized by adjusting an impedance being in parallel or in series with the antenna, so that the resonance frequency deviates only slightly from its predefined value due to changes in the surroundings of the antenna. In this way, the reflection characterized by the voltage standing wave ratio (VSWR) is also minimized, so that most of the power is transmitted. This has the advantage to saving battery life and it also increases the life of other electrical components in the mobile phone that do not need a large amount of reflected power.

With the foregoing and other objects in view, there is provided, in accordance with the invention, a radio station for transmitting signals. The radio station includes a modulator modulating a signal to be transmitted. A power amplifier connected to the modulator amplifies the modulated signal and producing an output power and a test signal. A summing device connected to the power amplifier subtracts the test signal of the power amplifier from a reference signal to generate a control signal. An antenna can transmit and receive the signals. Impedance with a variable reactance is switched between the antenna and the power amplifier. An analog-to-digital converter converts the control signal to a digital signal. A processor uses the digital signal to change the variable reactance of the impedance.

In accordance with a further feature of the invention, a processor calculates an optimum value for the impedance being switched to the antenna according to a measurement of the output power of a power amplifier in a transmitter of the mobile phone. Thereby, the output power is maximized.

Furthermore, it is an advantage that the processor stores the calculated values for each measured value, so that later, when again the measured value is measured, the processor simply takes the previously calculated value for the impedance in order to save processing time.

In accordance with a further feature of the invention, a directional coupler for transfers a part of the output power to a power detector, so that the power detector converts the part of the output power to a test voltage. The test voltage is used for adjusting a power amplifier and the variable reactance.

Moreover, it is an advantage to use a current of a last stage of the power amplifier to characterize the output power of the power amplifier for adjusting the power amplifier and the impedance. This is an easy solution and requires less circuit elements.

In accordance with a further feature of the invention, a voltage of the last stage of the power amplifier characterizes the output power of the power amplifier. This is an easy and exact solution to characterize the output power.

In accordance with a further feature of the invention, a plurality of capacitors and conductors adjust by switching some of those capacitors and inductors for the adjustment of the variable reactance.

Alternatively, in accordance with a further feature of the invention, the capacitors and inductors for the variable reactance can be changed individually. In this way, the number of necessary circuit elements for the impedance is reduced. This reduction lowers the cost of manufacturing.

Apart from this, a further feature of the invention uses different types of microstrip lines to provide the capacitance and inductance of the impedance. This leads to an easy, cheap, and straightforward implementation of the impedance.

Other features that are considered as characteristic for the invention are set forth in the appended claims.

Although the invention is illustrated and described herein as embodied in a radio station for transmitting signals, the invention is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
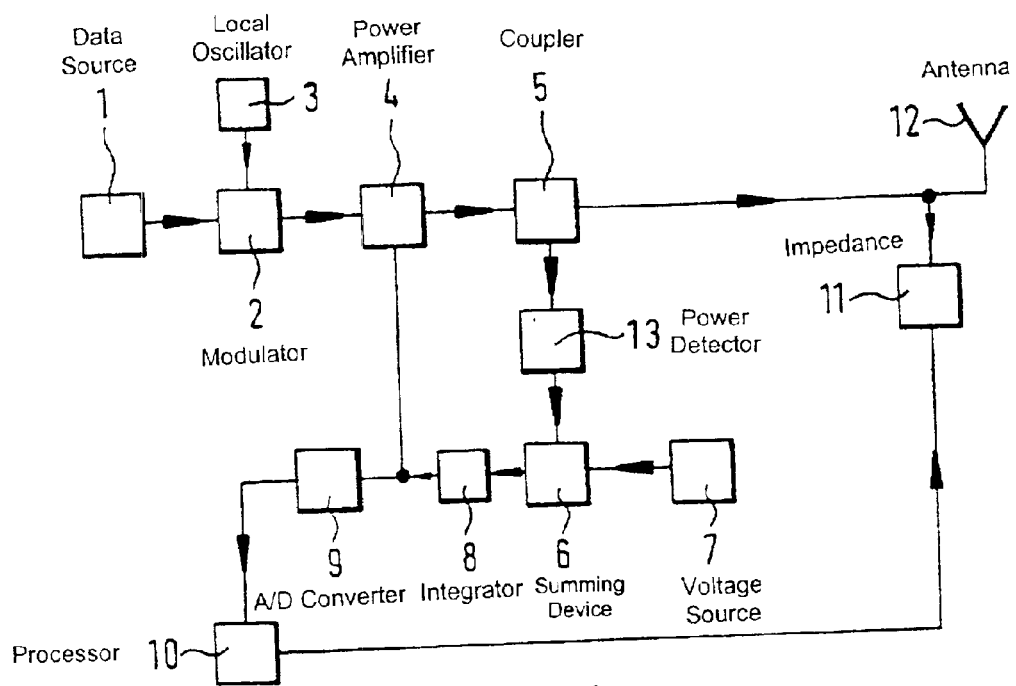
FIG. 1 shows a block diagram of a transmitter, a part of the output power being transferred to a power detector.

In all the figures of the drawing, sub-features and integral parts that correspond to one another bear the same reference symbol in each case.

Mobile phones are constructed with constantly smaller antennas in order to reduce the overall size of the mobile phone. An antenna exhibits a resonance frequency being centered in a frequency band allocated for transmitting signals by the mobile phone. The antenna is consequently modeled by a resonance circuit as an impedance and works as a bandpass. A smaller antenna shows a more limited bandwidth than a larger antenna.

The impedance of the antenna is changed by objects appearing in a vicinity of the antenna, because the objects reflect and absorb electromagnetic energy emitted from the antenna. Examples of such objects include a hand, different surroundings in a room, or other people. The objects cause a changed resonance frequency of the antenna due to the changed impedance of the antenna. The impedance of the antenna describes the antenna itself and objects near the antenna.

An object of the invention is to maximize the power outputted by the amplifier in a transmitter of a mobile phone as it transmits radio signals. When optimizing the power, the transmission power necessary for optimizing reception by a receiver must be considered. This means that the receiver can perform an error-free detection of the transmitted information. To provide this necessary transmission power, the power amplifier in the transmitter of the mobile phone must provide that transmission power in addition to power lost by reflections and attenuation from the output of the power amplifier to the antenna.

If the part of the reflected power is high, then the power amplifier must provide more output power than in the case of a small part of reflected power. This consumes unnecessary battery lifetime. Furthermore, the reflected power must be dissipated somewhere, so that the electrical components in the transmitter of the mobile phone must cope with the reflected power resulting in unnecessary electrical and thermal stress reducing. Therefore, it is desirable to minimize reflections due to the antenna impedance.

In microwave electronics, however, a concept of impedance matching is a precondition for a maximum power transfer from one device to another device, here, from the output of the power amplifier to the antenna. The matching condition is, that the output impedance of the power amplifier is matched by a complex conjugate impedance, so that all output power is transferred and reflections of power do not occur. A measure for how much power is reflected, is the so-called voltage standing wave ratio (VSWR). The higher the VSWR, the more power is reflected, e.g. a VSWR of 6 to 1 means that 3 dB of the total power is reflected, that is fifty percent (50%).

A concept to keep the output power of the power amplifier at a constant level is to apply the so called automatic gain control (AGC). Using AGC, the output power of the power amplifier is measured and converted to a test voltage. The test voltage is subtracted from a reference voltage to generate a difference voltage. The difference voltage gives a deviation of the test voltage from the reference voltage and thereby a deviation of the output power from the maximum amount of the output power. Consequently, the difference voltage is a measure for the VSWR and thereby of the impedance matching.

Referring now to the figures of the drawings in detail and first, particularly to FIG. 1 thereof, there is shown a block diagram of a transmitter is shown. A data source 1, most preferably a microphone 1, with attached electronics is used to generate a digital data stream that is then transferred to a modulator 2. The microphone 1 converts acoustical waves into electrical signals, whereas the attached electronics amplifies and digitizes these electrical signals to generate the digital data stream. Alternatively, other data sources 1 can be used: for example, a computer, a keyboard, or a camera.

The modulator 2 has a second data input that is used to receive signals from a local oscillator 3. The local oscillator 3 generates sine waves with a certain frequency. The digital data stream coming from the data source 1 is used to modulate those sine waves. Here, amplitude shift keying is used, that means a one (1) in the data streams lead to passing the sine waves whereas a zero (0) in the data stream sets also the sine waves to zero (0).

Alternatively, other modulation schemes can be used. In GSM, Gaussian minimum shift keying (GMSK) is used. In GMSK, the data bits are divided into even and odd bits and a high frequency and low frequency signal are mapped to bit groups including an even and an odd bit. If the odd bit is a 1 and the even bit is a 1, then a higher frequency signal is the modulated signal. If the odd bit or the even bit is a 1 and the corresponding odd or even bit is a −1, then a low frequency signal is the modulated signal. If the odd bit and the even bit are −1, then the modulated signal is again the high frequency signal. The resulting signal is then filtered by a Gaussian filter to make frequency transitions from the high frequency signal to the low frequency signal and vice versa smoother. GMSK is therefore a frequency shift keying modulation technique.

The modulated signal is then transferred to a first input of a power amplifier 4. The power amplifier 4 amplifies the modulated signal according to a signal coming from an integrator 8 into a second input of the power amplifier 4. The amplified signal is then transferred to a coupler 5. The coupler 5 transfers a small amount of the output power of the power amplifier 4 to a power detector 13. The larger amount (e.g. 99%) is transferred to an antenna 12 for transmitting the signals and to impedance 11 that is switched in parallel with the antenna 12. The impedance 11 exhibits a variable reactance in order to match the antenna impedance to the output impedance of the coupler 5. The impedance 11 also can be placed in series between the antenna 12 and the coupler 5. Embodiments of the impedance are described below.

The power detector 13 includes a diode converting the transferred power to a test voltage that is transferred to a first input of a summing device 6. The summing device 6 has a second input to which a reference voltage is applied, the reference voltage coming from a voltage source 7. The difference voltage generated by the summing device 6 is transferred to the integrator 8. The integrator 8 integrates the difference voltage in order to generate a control signal for the power amplifier 4 and for an analog-digital converter 9. The integrator 8 is used because an ideal integrator has an indefinite gain for steady state signals and consequently a real integrator has a very high gain for steady state signals which is necessary for the stability of a loop.

The analog-digital converter 9 converts the control signal to a digital signal. A digital signal is then transferred from the analog-digital converter 9 to a processor 10. The processor 10 calculates for the digital signal impedance setting of the impedance 11. This is used to match the antenna impedance to the output impedance of the coupler 5. In this way, a maximum amount of power is transferred to the antenna 12 for radio transmission.

Figure 2:
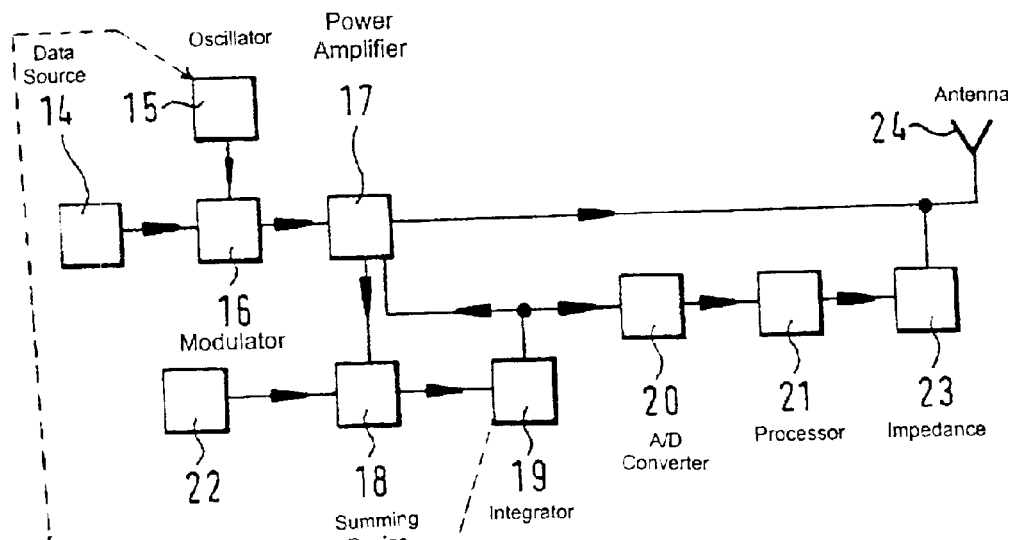
FIG. 2 shows a block diagram of a transmitter, a current being converted to a voltage and the voltage being used as a test voltage.

In FIG. 2, a second embodiment of a transmitter after the invention is shown. A data source 14, which is, as mentioned above a microphone with an attached electronics is connected to a first input of a modulator 16. The modulator 16 has a second input that is used for receiving signals from a local oscillator 15. The modulated signal is then transferred from the modulator 16 to a first input of a power amplifier 17. The power amplifier 17 amplifies the modulated signal according to a control signal from an integrator 19. The amplified signal is then transferred to an antenna 24 and impedance 23 which is switched in parallel to the antenna 24. The impedance 23 is used to match the impedance of the antenna 24 to the output impedance of the power amplifier 17.

Alternatively, the impedance 23 can be switched in series between the power amplifier 17 and the antenna 24.

From the power amplifier 17, an output is connected to a summing device 18. This data output transfers a current of the last stage of the power amplifier 17 to the summing device 18. In the summing device 18, this current is converted to a test voltage. Then, the summing device 18 subtracts this test voltage from a reference voltage, the reference voltage being generated by a voltage source 22. The difference of the test voltage and the reference voltage is then transferred to the integrator 19, which integrates the difference voltage. The output of the integrator 19 is connected to a second input of the power amplifier 17 and to an analog-digital converter 20. The analog-digital converter 20 converts the control signal of the integrator into a digital signal. The digital signal is then transferred from the analog-digital converter 20 to a processor 21. The processor 21 calculates for the digital signal an optimum impedance setting for the impedance 23. A signal is then transferred from the processor 21 to the impedance 23. The impedance 23 exhibits a signal processing unit that is used for setting a variable reactance of the impedance 23. Alternatively, the processor 21 sets the impedance 23 directly.

Figure 3:
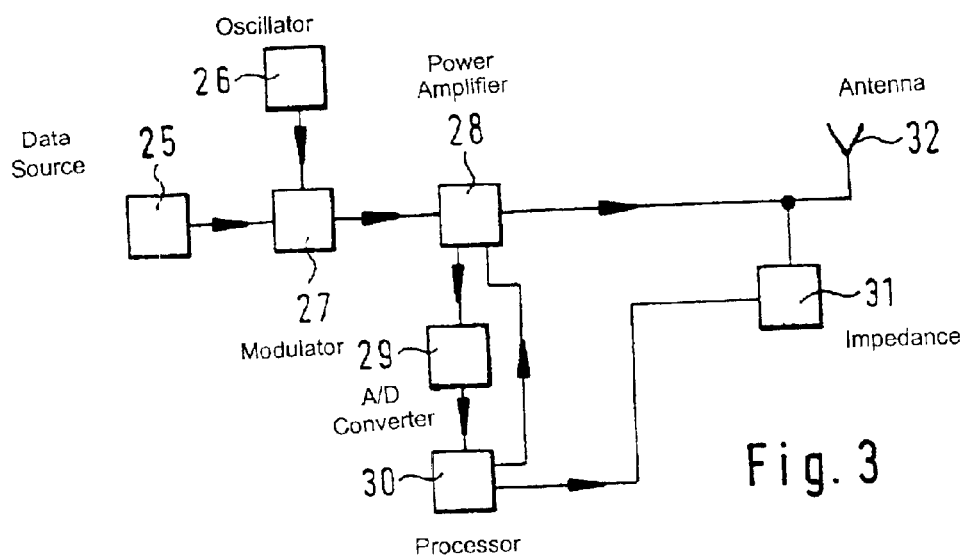
FIG. 3 shows a block diagram of a transmitter, a voltage being used as a test voltage.

In FIG. 3, a third embodiment of the invention is shown. A data source 25 generates a digital data stream that is transferred to a modulator 27 modulating the digital data stream on a signal containing of single frequency sine waves coming from a local oscillator 26. The modulated signal is then transferred from the modulator 27 to a power amplifier 28. The power amplifier 28 amplifies the modulated signal according to a control signal coming from a processor 30. The amplified signal is then transferred from a first output of the power amplifier 28 to an antenna 32 and an impedance 31 that is connected in parallel with the antenna 32. Again, the impedance 31 can be switched in series to the antenna 32. The impedance 31 is used for matching an antenna impedance to an output impedance of the power amplifier 28 in order to achieve a maximum power transfer from the power amplifier 28 to the antenna 32.

A second output of the power amplifier 28 is connected to an analog-digital converter 29. A voltage from the last stage of the power amplifier 28 is transferred to the analog-digital converter 29. The voltage is characteristic for the actual output power of the power amplifier 28. The analog-digital converter 29 converts this test voltage to a digital signal that is transferred to the processor 30. The processor 30 calculates for this test signal an optimum impedance for the impedance 31 and transfers an according signal to the impedance 31. Furthermore, the processor 30 is connected by a second output to the power amplifier 28 to send a control signal to the power amplifier 28. Attached to the impedance 31 is a signal processing unit that is used to set a variable reactance of the impedance 31, so that a matching to the output impedance of the amplifier 28 is achieved.

Figure 4:
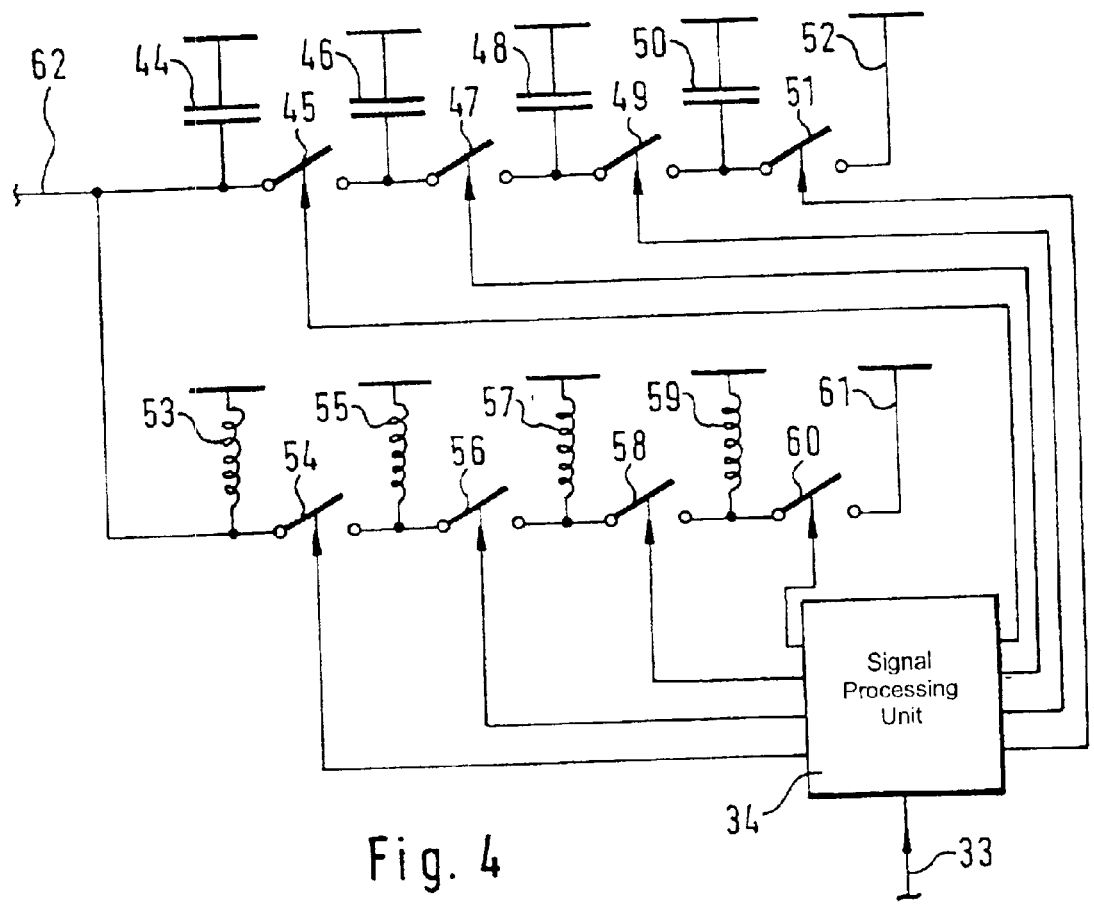
FIG. 4 is a schematic diagram showing a circuit with inductors and capacitors switched in parallel.

In FIG. 4, a circuit diagram of the impedance 31 is shown. This circuit diagram is also valid for the impedances 11 and 23. A signal processing unit 34 receives a signal 33 from the processor 30. According to this signal 33, the signal processing unit 34 operates switches that connect inductors and capacitors being switched in parallel. The signal processing unit 34 is therefore connected to a switch 54 and to switches 56, 58, 60, 45, 47, 49 and 51. The signal processing unit 34 opens and closes those switches.

The switches 54, 56, 58 and 60 connect inductors switched in parallel together. An inductor 53 is connected to a ground and on the other side to the switch 54 and an output 62 which is connected to the output of the amplifier 28 and the antenna 32. The switch 54 is on the other side connected to an inductor 55 that is also connected to the switch 56. The inductor 55 is on the other side connected to a ground. The switch 56 is on the other side connected to an inductor 57 and a switch 58. The inductor 57 is connected on the other side to a ground. The switch 58 is connected on the other side to an inductor 59 and the switch 60. The inductor 59 is connected on the other side to a ground. The switch 60 is connected on the other side to a ground.

Figure 5:
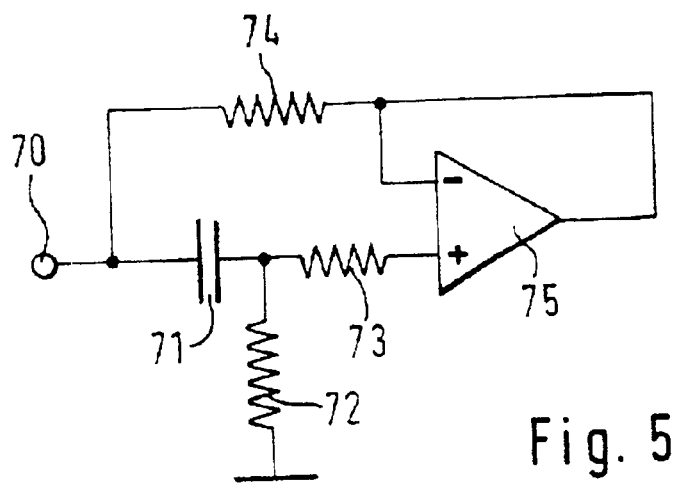
FIG. 5 is a schematic diagram showing a circuit replacing an inductor.

To embody the inductors in integrated circuits, an inductor is replaced by a circuit made of other circuit elements like resistors, operational amplifiers and capacitors. In FIG. 5, such a circuit is presented. An input 70 of the circuit is connected to a capacitor 71 and to a resistor 74. The capacitor 71 is on its other side connected to a resistor 72 which is connected itself to a ground and to a resistor 73 which is then connected to a positive input of an operational amplifier 75. Mircostrip lines are an alternative; they are explained below.

The resistor 75 is connected on its other side to the negative input of the operational amplifier 75 and to the output of the operational amplifier 75. From the input 70, an inductance which is determined by the value of the capacitor 71, the resistor 72, 73, and 74 and the operational amplifier 75.

The switches 45, 47, 49, and 51 are used to switch capacitors together in parallel. The capacitor 44 is on one side connected to a ground and on the other side connected to the switch 45 and to the output 62. The switch 45 is connected on the other side to a capacitor 46 and a switch 47. The capacitor 46 is connected on the other side to a ground. The switch 47 is connected on the other side to the capacitor 48 and to the switch 49. The capacitor 48 is connected on the other side to a ground. The switch 49 is connected on the other side to the capacitor 50 and to the switch 51. The capacitor 50 is connected on the other side to a ground. The switch 51 is connected on the other side to a ground.

By switching together these inductors and capacitors, several values for a reactance of the impedance 31 are realized. The number of possible reactances can be increased by switching together more capacitors and more inductors together. Alternatively, one can realize the inductors and capacitors by variable inductors and capacitors. Then, a signal processing unit applies directly a signal to the capacitors and conductors in order to change respectively the capacitance and inductance of these circuit elements.

Apart from realizing the impedance with the variable reactance separate from the antenna, the variable reactance can be integrated in the antenna. For mobile phones, patch antennas are widely used. A patch antenna includes a metal plate deposited on a dielectric layer. The dielectric layer is either a substrate itself or it is deposited on another substrate, for example on a semiconductor substrate on which the electronics is fabricated. A feed line to the patch antenna is either buried below the dielectric layer using electromagnetic coupling for transferring the signals from the feed line to the patch antenna or the feed line is a microstrip line in vicinity to the antenna also using electromagnetic coupling or the feed line is directly connected to the patch antenna or the feed line consists of a slot through the dielectric layer thereby providing a waveguide.

Figure 6:
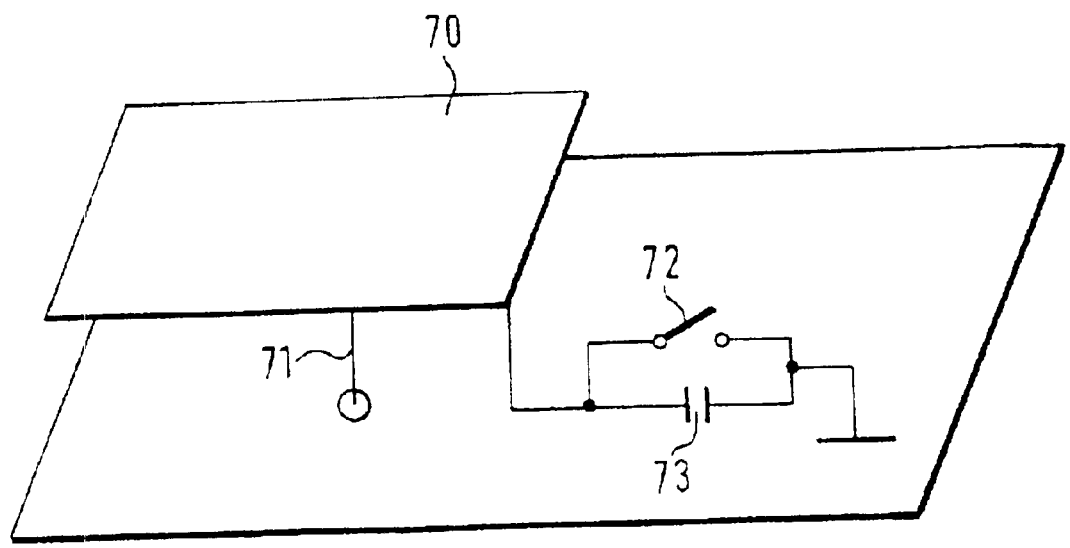
FIG. 6 is a partial diagram and partial schematic view showing a patch antenna with a switchable capacitor in series with a shortening pin.

In FIG. 6, a patch antenna with a variable reactance is shown. A metal plate 70 as the patch antenna is fed by a line 71 connecting the patch antenna 70 and a transmitter with the power amplifier and a receiver. Thus, the antenna 70 receives the signals to be transmitted by the line 71.

Furthermore, a shortening pin (not shown) is connected to the antenna 70. The shortening pin is connected to a switch 72 and a capacitor 73, which are grounded. By opening and closing the switch, the reactance of the antenna 70 is changed. By adding more capacitors and switches, more values for the reactance can be realized. The shortening pin 83 exhibits an inductance. The switch 72 is either operated by an attached signal processing unit that is connected to a processor described above or by the processor itself. The shortening pin 83 passes through the dielectric layer.

Figure 7:
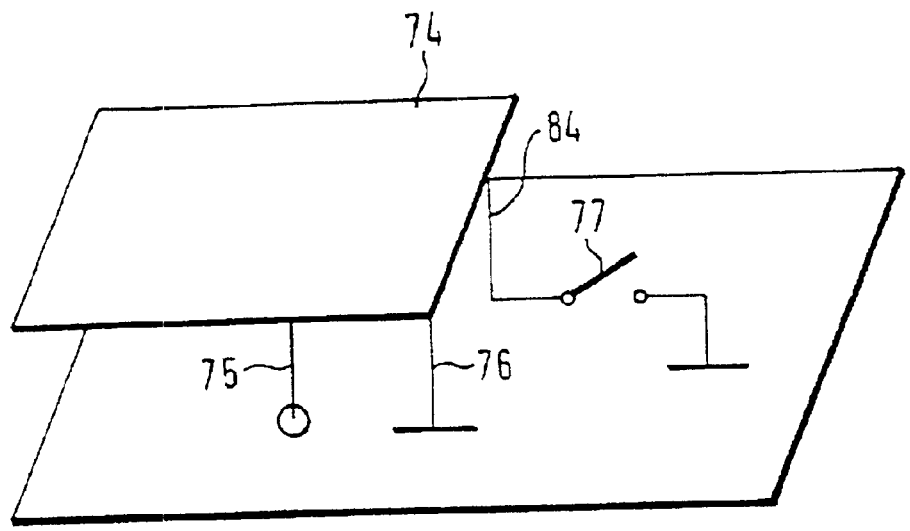
FIG. 7 is a view similar to FIG. 6 showing a patch antenna with a switchable shortening pin.

In FIG. 7, another embodiment of realizing the variable reactance is shown. A metal plate 74 acting as an antenna is fed by a line 75. A shortening pin 76 as an inductor connects the metal plate 74 to a ground whereas another shortening pin 84 as an additional inductor connects the metal plate 74 to a switch 77 which connects the shortening pin 84 to a ground. By opening and closing the switch 77 the inductance of the antenna is changed. By adding more shortening pins more inductance values can be realized. In combination with the capacitors switched to the metal plate 74 as shown in FIG. 6, using these shortening pins with switches an even wider range of reactance values can be realized. For the operation of the switch 77, the same is valid as mentioned for FIG. 6.

Figure 8:
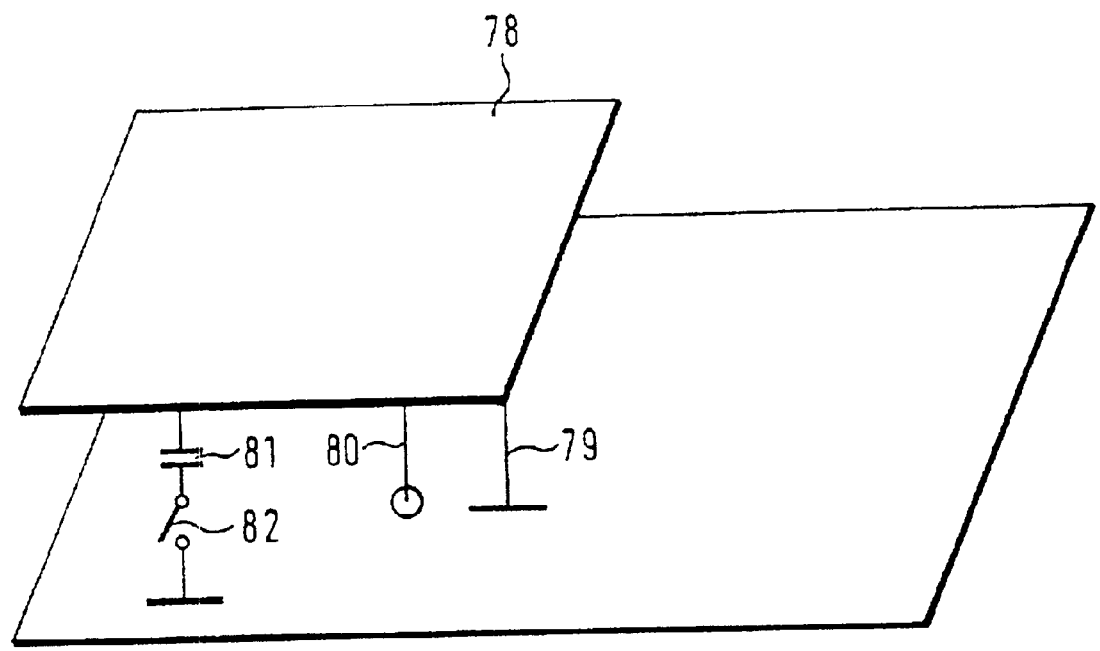
FIG. 8 is a partial schematic view similar to FIG. 6 showing a patch antenna with a switchable capacitor.

In FIG. 8, another embodiment of realizing the variable reactance is shown. A metal plate 78 acting as an antenna is fed by a line 80 with the signals to be transmitted. A shortening pin 79 connects the metal plate to a ground and provides an inductance. A capacitor 81 connects the metal plate 78 to a switch 82 that is itself connected to a ground. By opening and closing the switch 82, a variable capacitance and thereby a variable reactance is realized. Adding more capacitors with switches extends the range of possible reactances. By combining this realization with those presented in FIG. 6 and FIG. 7, a very large range of possible reactances can be realized. A further extension is possible by adding capacitors with variable capacitances. For the operation of the switch 82, the same is valid as mentioned for FIG. 6.

Reactances can also be realized by microstrip lines. Due to length of a microstrip line, it transforms an open end of the microstrip line or a shortcut to any reactance, so that capacitors and inductors can be replaced. In microwave engineering, a length of a transmission line is no longer much smaller than a wavelength of a signal, so that an individual length of a transmission line determines which phase and amplitude of the signal is at the end of the transmission line, so that depending on the length of the transmission line you see once an inductance or a capacitance at the end of the transmission line.

A microstrip line is a transmission line including a metallized strip and a solid ground plane metallization separated by a thin, solid dielectric. This transmission line configuration is used since it permits accurate fabrication of transmission line elements on a ceramic substrate.

The processor stores the calculated impedance setting for each measured value thereby creating a table putting measured values in relation to the calculated impedance settings. Next time, when again a value is measured that is stored in the table, then the processor does not need to perform calculations again but it takes only the previously calculated value out of the table and transmits it to the impedance. When there are enough values in the table, the processor can start to interpolate for newly measured values that are between to previously measured values in order to save processing time and storage capacity.

In addition, the processor stores the actual value of the impedance, so that if the measurement leads to the same value, the processor will not transmit a signal to the impedance.

We claim:

1. A radio station for transmitting signals, the radio station comprising:

a modulator modulating a signal to be transmitted;

a power amplifier connected to said modulator for amplifying the modulated signal and producing an output power and a test signal;

a summing device connected to said power amplifier for subtracting the test signal of the power amplifier from a reference signal to generate a control signal;

an antenna for transmitting and receiving the signals, and a connection from said antenna to ground and a switch in said connection for varying a reactance of said antenna;

an analog-to-digital converter converting the control signal to a digital signal; and a processor using the digital signal to drive said switch.

2. The radio station according to claim 1, wherein said summing device subtracts a supply current of said power amplifier from a reference current to generate a difference current; and an integrator is connected to said power amplifier for integrating the difference current to generate the control signal; and said power amplifier generates the output power according to the control signal.

3. The radio station according to claim 1, including:

an impedance with a variable reactance being switched between said antenna and said power amplifier; and said processor using the digital signal to change said variable reactance of said impedance.

4. The radio station according to claim 3, wherein said processor calculates an optimum value for the variable reactance of said impedance according to the digital signal.

5. The radio station according to claim 4, wherein said processor includes a table storing the optimum value for the variable reactance of said impedance for the digital signal and relating the stored optimum value to the respective digital signal and a respective output power of said power amplifier.

6. The radio station according to claim 5, wherein said processor compares the digital signal with stored values of the digital signal to determine the reactance of said impedance.

7. The radio station according to claim 4, including:

a directional coupler transferring a first part of the output power of said power amplifier as the test signal;

a power detector connected to said directional coupler and said summing device and receiving the first part of the output power, said power detector converting the first part of the output power of the power amplifier to a voltage;

said summing device subtracting the voltage from a reference voltage to generate a difference voltage; and an integrator connected to said summing device receiving the difference voltage, and integrating the difference voltage to generate the control signal and the power amplifier generating an output power according to the control signal.

8. The radio station according to claim 4, wherein said impedance includes a plurality of capacitors switched together in parallel connected by switches of a plurality of conductors switched together in parallel and a signal processing unit operating said switches according to a signal from said processor.

9. The radio station according to claim 7, wherein said impedance includes a capacitor, an inductor, and a signal processing unit for changing a capacitance of said capacitor and an inductance of said inductor by applying signals to said capacitor and said inductor.

10. The radio station according to claim 7, wherein said impedance includes a plurality of microstrip lines switched together in parallel and a signal processing unit sending signals placed between said microstrip lines according to a signal of said processor.

11. The radio station according to claim 3, wherein said power amplifier has a gain, said analog-digital converter converts a test voltage as the control signal of the power amplifier into the digital signal, and said processor adjusts the gain of said power amplifier and the variable reactance of the impedance according to the control signal.

12. The radio station according to claim 1, wherein a capacitor is connected in series with said switch in said connection.

13. The radio station according to claim 1, wherein a capacitor is connected in parallel with said switch in said connection.

* * * * *